(12) United States Patent
Szymanowski et al.

(10) Patent No.: US 10,476,442 B2
(45) Date of Patent: Nov. 12, 2019

(54) SEMICONDUCTOR PACKAGE HAVING AN ISOLATION WALL TO REDUCE ELECTROMAGNETIC COUPLING

(71) Applicant: NXP USA, Inc., Austin, TX (US)

(72) Inventors: Margaret A. Szymanowski, Chandler, AZ (US); Sarmad K. Musa, Gilbert, AZ (US); Fernando A. Santos, Chandler, AZ (US); Mahesh K. Shah, Scottsdale, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/141,686

(22) Filed: Sep. 25, 2018

(65) Prior Publication Data

US 2019/0028063 A1 Jan. 24, 2019

Related U.S. Application Data

(60) Division of application No. 15/267,455, filed on Sep. 16, 2016, now Pat. No. 10,110,170, which is a
(Continued)

(51) Int. Cl.
*H03F 1/02* (2006.01)
*H01L 23/552* (2006.01)
(Continued)

(52) U.S. Cl.
CPC ....... *H03F 1/0288* (2013.01); *H01L 21/4821* (2013.01); *H01L 23/3121* (2013.01); *H01L 23/492* (2013.01); *H01L 23/49541* (2013.01); *H01L 23/49575* (2013.01); *H01L 23/552* (2013.01); *H01L 23/66* (2013.01);
(Continued)

(58) Field of Classification Search
None
See application file for complete search history.

(56) References Cited

U.S. PATENT DOCUMENTS 3,903,590 A 9/1975 Yokogawa
6,961,245 B2 11/2005 Ikuta et al.
(Continued)

FOREIGN PATENT DOCUMENTS

JP 09-082880 3/1997
JP 10-200349 3/1998
(Continued)

OTHER PUBLICATIONS

Non-Final Office Action dated Jan. 23, 2017 for U.S. Appl. No. 14/549,934, 18 pages.
(Continued)

*Primary Examiner* — Robert K Carpenter
(74) *Attorney, Agent, or Firm* — Sherry W. Schumm

(57) ABSTRACT

A system and method for packaging a semiconductor device that includes a wall to reduce electromagnetic coupling is presented. A semiconductor device has a substrate on which a first circuit and a second circuit are formed proximate to each other. An isolation wall of electrically conductive material is located between the first circuit and the second circuit, the isolation wall being configured to reduce inductive coupling between the first and second circuits during an operation of the semiconductor device. Several types of isolation walls are presented.

14 Claims, 7 Drawing Sheets

Related U.S. Application Data continuation of application No. 14/104,870, filed on Dec. 12, 2013, now Pat. No. 9,450,547.

(51) Int. Cl.
| | | |
|---|---|---|
| *H03F 3/213* | (2006.01) | |
| *H01L 23/495* | (2006.01) | |
| *H01L 23/31* | (2006.01) | |
| *H01L 23/492* | (2006.01) | |
| *H01L 23/66* | (2006.01) | |
| *H03F 3/195* | (2006.01) | |
| *H01L 21/48* | (2006.01) | |
| *H01L 23/00* | (2006.01) | |
| *H01L 25/065* | (2006.01) | |
| *H01L 25/00* | (2006.01) | |
| *H03F 3/21* | (2006.01) | |

(52) U.S. Cl.
CPC ............ *H01L 24/49* (2013.01); *H01L 24/85* (2013.01); *H01L 25/0655* (2013.01); *H01L 25/50* (2013.01); *H03F 3/195* (2013.01); *H03F 3/211* (2013.01); *H03F 3/213* (2013.01); *H01L 24/48* (2013.01); *H01L 2223/6611* (2013.01); *H01L 2223/6644* (2013.01); *H01L 2224/45099* (2013.01); *H01L 2224/48091* (2013.01); *H01L 2224/48106* (2013.01); *H01L 2224/48195* (2013.01); *H01L 2224/48247* (2013.01); *H01L 2224/49175* (2013.01); *H01L 2924/00014* (2013.01); *H01L 2924/19041* (2013.01); *H01L 2924/19105* (2013.01); *H01L 2924/19107* (2013.01); *H01L 2924/3011* (2013.01); *H01L 2924/3025* (2013.01); *H03F 2200/451* (2013.01); *H03F 2203/21106* (2013.01)

(56) References Cited

U.S. PATENT DOCUMENTS

| | | |
|---|---|---|
| 9,240,390 B2 | 1/2016 | Kuo et al. |
| 9,401,342 B2 | 7/2016 | Meen Kuo et al. |
| 9,673,164 B2 | 6/2017 | Watts et al. |
| 2012/0025356 A1 | 2/2012 | Liao et al. |
| 2012/0247819 A1 | 10/2012 | Tsuyutani et al. |
| 2013/0026632 A1 | 1/2013 | Kikuchi et al. |
| 2014/0167858 A1* | 6/2014 | van Zuijlen ............ H01L 23/66 330/295 |

FOREIGN PATENT DOCUMENTS

| | | |
|---|---|---|
| JP | H11158448 A | 6/1999 |
| WO | WO-2012/101920 A1 | 8/2012 |

OTHER PUBLICATIONS

Non-Final Office Action dated Nov. 1, 2018 for U.S. Appl. No. 15/988,743 13 pgs.

Notice of Allowance; U.S. Appl. No. 15/988,743; 8 pages (dated Mar. 28, 2019).

\* cited by examiner

US 10,476,442 B2

SEMICONDUCTOR PACKAGE HAVING AN ISOLATION WALL TO REDUCE ELECTROMAGNETIC COUPLING

CROSS-REFERENCE TO RELATED APPLICATION

This application is a divisional of co-pending U.S. patent application Ser. No. 15/267,455, filed on Sep. 16, 2016, which is a continuation of U.S. patent application Ser. No. 14/104,870, filed on Dec. 12, 2013, and issued on Sep. 20, 2016 as U.S. Pat. No. 9,450,547.

STATEMENT REGARDING FEDERALLY SPONSORED RESEARCH OR DEVELOPMENT

Not Applicable

BACKGROUND

Field of Use

The present disclosure relates generally to semiconductor device packages, and more specifically, to such packages incorporating a mechanism to reduce electromagnetic coupling between adjacent circuits therein.

Description of the Related Art

Wireless communication systems often employ power amplifiers for increasing the power of a signal. In a wireless communication system, a power amplifier is usually the last amplifier in a transmission chain (the output stage). High gain, high linearity, stability, and a high level of power-added efficiency (i.e., the ratio of the difference between the output power and the input power to DC power) are characteristics of an ideal amplifier.

In general, a power amplifier operates at maximum power efficiency when the power amplifier transmits peak output power. However, power efficiency tends to worsen as output power decreases. Recently, Doherty power amplifier architecture has been the focus of attention not only for base stations, but also for mobile terminals because of the architecture's high power-added efficiency.

A Doherty power amplifier includes two or more amplifiers, such as a carrier amplifier and a peaking amplifier. These amplifiers can be connected in parallel with their outputs joined by an offset transmission line, which performs impedance transformation. The peaking amplifier delivers current as the carrier amplifier saturates, thereby reducing the impedance seen at the output of the carrier amplifier. Thus, the carrier amplifier delivers more current to the load while the carrier amplifier is saturated because of a "load-pulling" effect. Since the carrier amplifier remains close to saturation, a Doherty power amplifier is able to transmit peak output power so that the total efficiency of the system remains relatively high.

Such power amplifiers commonly are fabricated in a single semiconductor package. However, the circuit architecture presents challenges in terms of the semiconductor package design. Current Doherty power amplifier semiconductor package design calls for the use of discrete devices and integrated circuits that may involve one device that includes the carrier amplifier and a separate device that includes the peaking amplifier. These discrete devices are maintained a distance apart in the package in order to limit problems with crosstalk that can occur between the carrier and peaking amplifiers.

Unfortunately, maintaining spatial distance between amplifiers in the package limits the potential for miniaturization of the semiconductor package. Limiting miniaturization is undesirable where low cost, a low weight, and a small volume are important package attributes for various applications.

BRIEF DESCRIPTION OF THE DRAWINGS

The present disclosure is illustrated by way of examples and embodiments and is not limited by the accompanying figures, in which like reference numbers indicate similar elements. For simplicity and clarity of illustration, the drawing figures illustrate the general manner of construction, and descriptions and details of well-known features and techniques may be omitted to avoid unnecessarily obscuring the invention. Elements in the figures are illustrated for simplicity and clarity and have not necessarily been drawn to scale. In fact, the dimensions of some of the elements or regions in the figures may be exaggerated relative to other elements or regions to improve understanding of embodiments of apparatus. The figures along with the detailed description are incorporated and form part of the specification and serve to further illustrate examples, embodiments and the like, and explain various principles and advantages, in accordance with the present disclosure, where.

DETAILED DESCRIPTION

Figure 1:
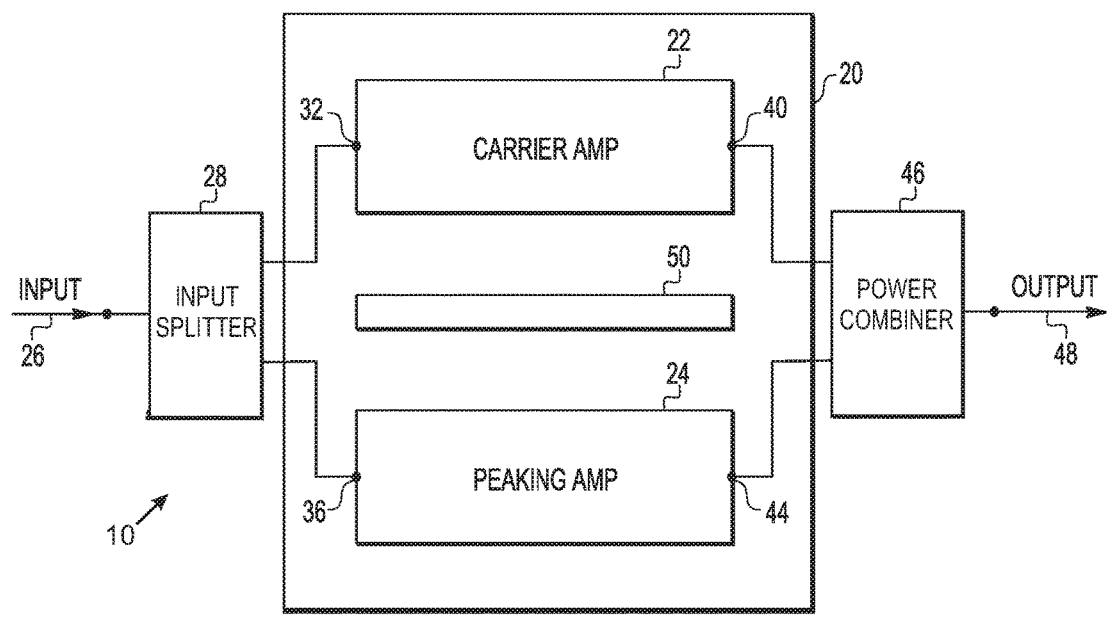
FIG. 1 is a block diagram of an example embodiment of a Doherty power amplifier in a semiconductor package with an isolation wall.

The following detailed description is exemplary in nature and is not intended to limit the invention or the application and uses of the same. Furthermore, there is no intention to be bound by any expressed or implied theory presented in the preceding technical field, background, or the following detailed description.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Reference herein to directional relationships, such as top and bottom or left and right, refer to the relationship of the components in the orientation illustrated in the drawings, which may not be the orientation of the components in all uses of the apparatus being described. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. The terms "substantial" and "substantially" herein mean sufficient to accomplish the stated purpose in a practical manner and that minor imperfections, if any, are not significant for the stated purpose.

The present embodiments may be used to improve the usability of a power amplifier semiconductor package in base station power amplifiers, cell phones, other portable devices, and other apparatus dependent upon semiconductor packages, where low cost, low weight, and small volume are desired. The embodiments described herein may reduce inductive coupling between components and wire bond arrays in a multi-path power amplifier (including but not limited to Doherty power amplifiers). However, it will become apparent that the techniques described below for reducing inductive coupling and electromagnetic interference may be implemented in a variety of semiconductor device designs and other circuits.

FIG. 1 shows a block diagram of a Doherty power amplifier 10 that includes a carrier amplifier 22 and a peaking amplifier 24 connected in parallel. The carrier amplifier 22 and peaking amplifier 24 are fabricated in a semiconductor package 20. An input signal 26 is split into two signals by an input splitter 28, which may apply a phase delay to one of the signals (e.g., a 90 degree phase delay). One of the resulting input signals is applied to a first input 32 of the carrier amplifier 22, and the other input signal is applied to a second input 36 of the peaking amplifier 24. The carrier amplifier 22 produces a first output signal at a first output 40 and the peaking amplifier 24 produces a second output signal at a second output 44. In a Doherty configuration, the first input 32 and the first output 40 may constitute a gate terminal and a drain terminal of the carrier amplifier 22, respectively; and the second input 36 and the second output 44 may constitute a gate terminal and a drain terminal of the peaking amplifier 24, respectively. The first and second output signals are combined through a power combiner 46 to produce a combined output signal 48. Those skilled in the art will recognize that a Doherty power amplifier semiconductor package typically includes additional electronic devices and circuitry not shown herein for simplicity of illustration.

In one embodiment, the carrier amplifier 22 is configured to be active for an entire range of output powers of Doherty power amplifier 10. Peaking amplifier 24 is configured to turn on only when the carrier amplifier 22 saturates. Power combiner 46, operating to combine the first output signal from the carrier amplifier 22 with the second output signal from peaking amplifier 24, may include a quarter-wave impedance inverter. The quarter-wave impedance inverter can add a ninety degree lag to the output signal from the carrier amplifier 22 or the peaking amplifier 24 in order to compensate for the phase delay added by the input splitter to the signal provided to either the peaking amplifier 24 or the carrier amplifier. The phase of the signal provided to peaking amplifier 24 is typically designed to lag that of the carrier amplifier 22 by ninety degrees so that the two output signals add in-phase when the output signals are combined at the output of power combiner 46 to form combined output signal 48.

In the exemplary circuit in FIG. 1, each of the carrier amplifier 22 and peaking amplifier 24 may include a number of active and passive electrical elements. For example, the carrier amplifier 22 may include a first capacitor that couples the first input 32 to a first transistor, which applies the appropriate amplification to the first input signal received at that input. An output of the first transistor can be connected to a second capacitor. The first and second capacitors operate to condition the input first signal that is amplified by the first transistor. Similarly, the peaking amplifier 24 can include a third capacitor coupling the second input 36 to a second transistor, which applies the appropriate amplification to the second input signal received at the second input. An output of the second transistor can be connected to a fourth capacitor. The third and fourth capacitors operate to condition the input second signal that is amplified by the second transistor. Those skilled in the art will recognize that the carrier amplifier 22 and peaking amplifier 24 may include additional electronic components not shown herein for simplicity of illustration.

Figure 2A:
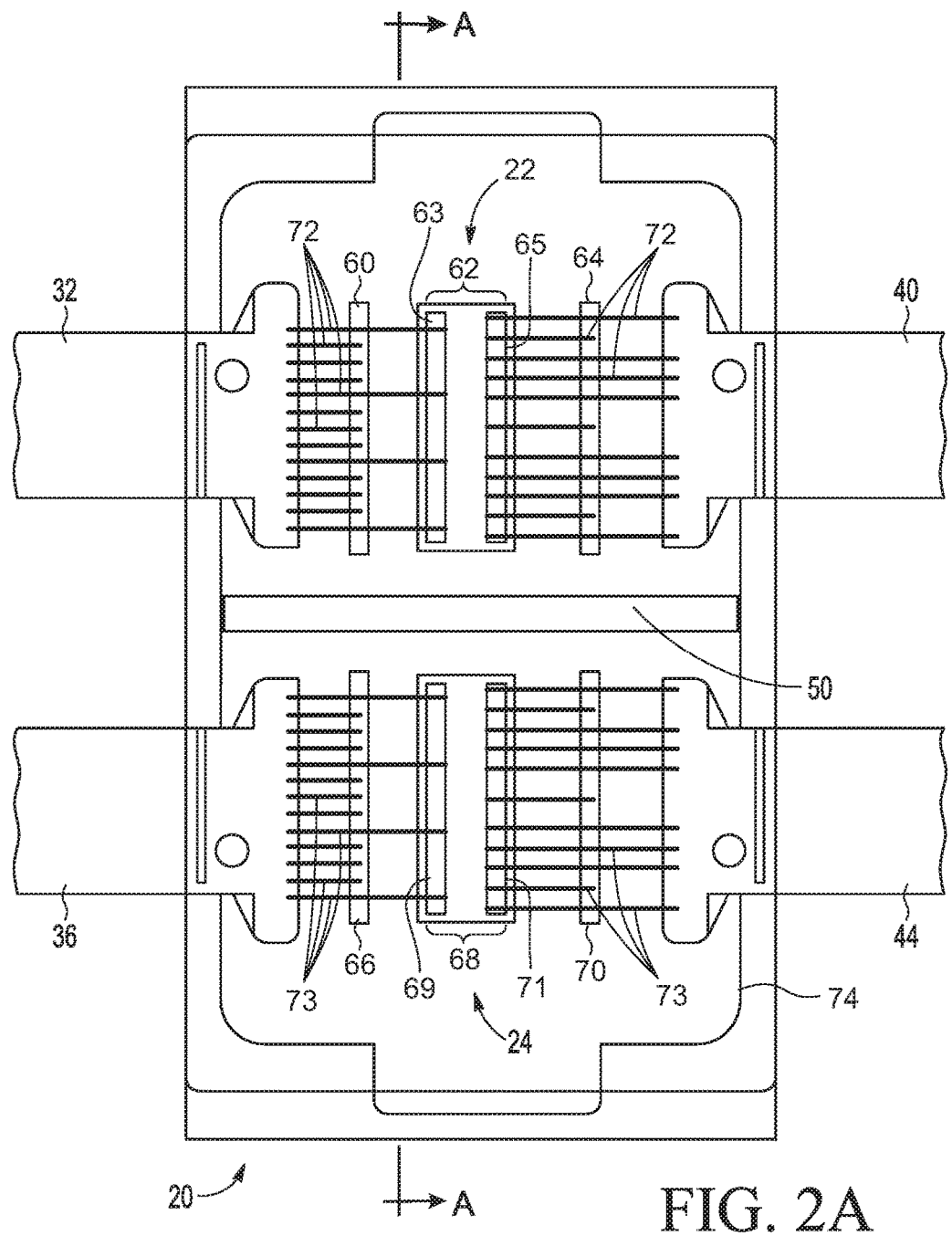
FIG. 2A is a top schematic view of components of the carrier and peaking amplifiers for an example embodiment of a Doherty power amplifier in a semiconductor package.
Figure 2B:
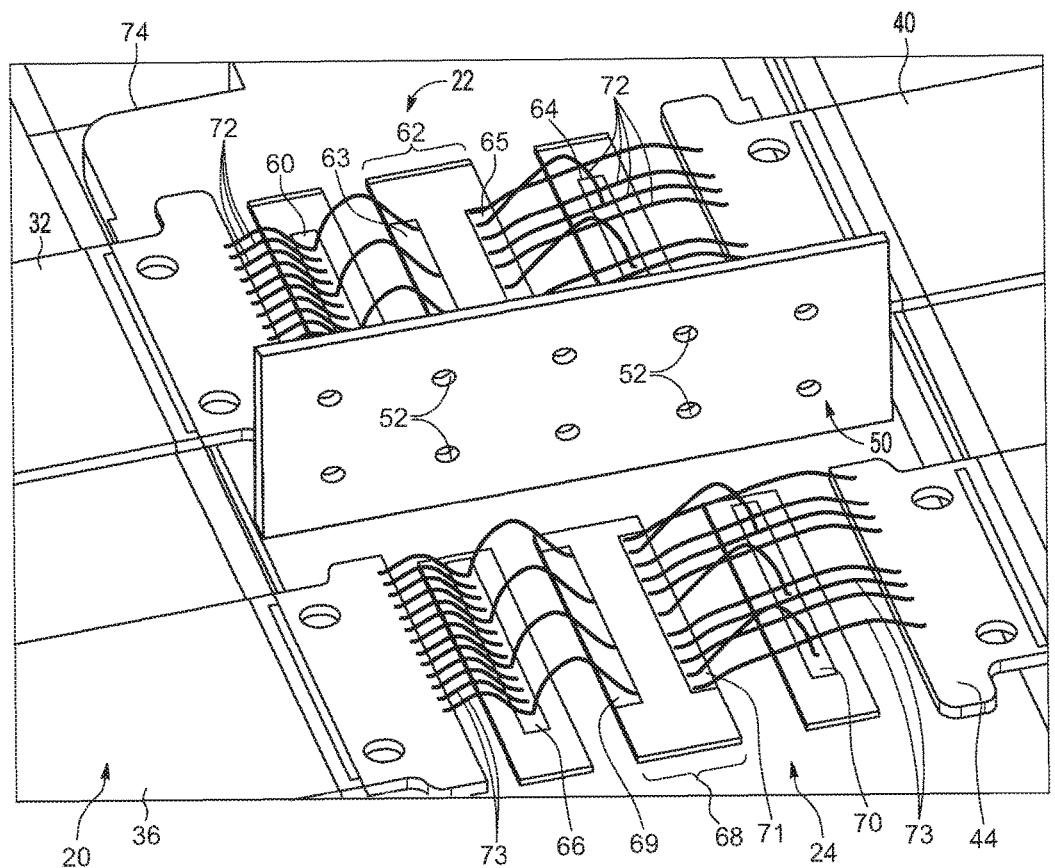
FIG. 2B is a perspective view of the Doherty power amplifier components in the semiconductor package of FIG. 2A.

With reference to the semiconductor package 20 in FIGS. 2A and 2B, the separate electrical devices making up the carrier amplifier 22 and the peaking amplifier 24 are connected to one another using multiple wires 72 and 73, known as wire bonds. In a practical application, one or more of the signal paths (e.g., between inputs, outputs, capacitors and transistors) of the carrier amplifier 22 may be established using wire bonds. Likewise, wire bonds may be used to establish one or more of the signal paths of carrier amplifier 22 and peaking amplifier 24.

The carrier amplifier 22 includes a number of electrical components, such as capacitors 60 and 64 and transistor 62 (having gate pad 63 and drain pad 65) manufactured and/or subsequently mounted to the surface of a common (i.e., single) carrier, such as a package ground plane 74. Capacitors 60 and 64 may be, for example, MOS capacitors mounted on ground plane 74. Similarly, the peaking amplifier 24 includes a number of electrical devices, such as capacitors 66 and 70 and transistor 68 (having gate pad 69 and drain pad 71) manufactured on or subsequently mounted to the surface of a common (i.e., single) carrier, such as a package ground plane 74. Capacitors 66 and 70 may be, for example, Metal-Oxide-Semiconductor (MOS) capacitors mounted on ground plane 74.

The symmetrical layout of the depicted semiconductor package 20 can result in the components of the carrier amplifier 22 being adjacent to corresponding components of the peaking amplifier 24. Accordingly, the arrangement of various components of each amplifier (including, specifically, the wire bonds 72 and 73 carrying high-frequency signals) are adjacent to and geometrically parallel with one another. These attributes of the wire bond arrays of the carrier and peaking amplifiers 22 and 24 can result in inductive coupling between the devices, which can reduce the performance of the overall circuit.

Therefore, in the present semiconductor package 20 for components of a Doherty power amplifier 10, an isolation wall 50 is formed between the carrier amplifier 22 and the peaking amplifier 24 to provide electrical isolation between the wire bonds arrays and other components of those amplifiers. The isolation wall 50, as described in greater detail below, is constructed as a body within the package between the circuitry of the carrier amplifier and the circuitry of the peaking amplifier. The material of the isolation wall 50 conducts, absorbs, or reflects electromagnetic emissions from either or both the carrier amplifier 22 or the peaking amplifier 24 preventing the emissions from reaching the other amplifier. The isolation wall 50 may be built on various substrates or a lead frame of the semiconductor package depending upon the particular package design implementation. Along with the other components in the semiconductor package 20, the isolation wall 50 may be over molded with a conventional encapsulant or may be within an air-cavity package. In various implementations, the isolation wall 50 may be connected directly to a ground plane 74 or to a ground terminal which may, in turn be connected to a ground potential during operation of the Doherty power amplifier 10. In general, the isolation wall 50 operates as a shield to interrupt and prevent the inductive coupling between the carrier amplifier and the peaking amplifier of the Doherty power amplifier 10.

The isolation wall 50 may take any one of several forms, such as those which are being described in detail herein. Nevertheless, other wall configurations may be used to implement the present inventive concept.

Figure 3:
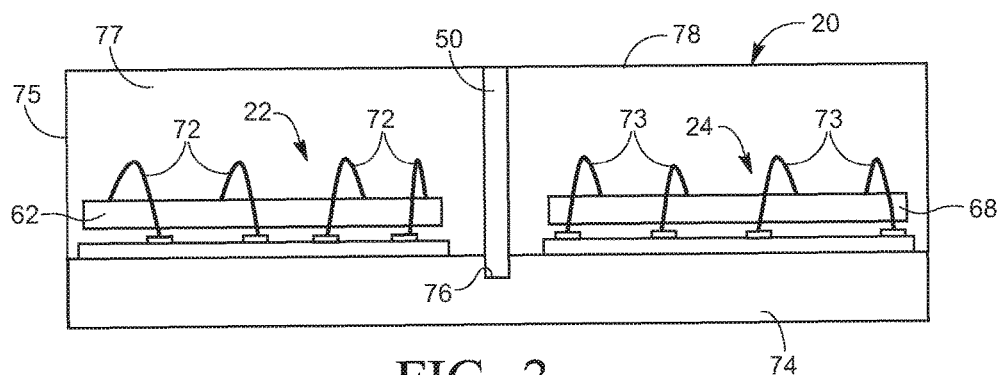
FIG. 3 is a cross section view taken along line A-A in FIG. 2A showing one embodiment of the isolation wall.

With particular reference to FIG. 2B, the isolation wall 50 is erected between the carrier amplifier 22 and the peaking amplifier 24 on the ground plane 74. According to various embodiments, the isolation wall 50 is positioned perpendicular to the ground plane 74 and extends some distance above a maximum height of the various components of the carrier amplifier 22 and peaking amplifier 24 (and their associated wire bonds). In the situation in which the electronic circuit is encapsulated to form a housing 75 of the semiconductor package 20 (see FIGS. 5 and 6), the isolation wall 50 may have a plurality of small holes 52 to allow the encapsulant to flow there through during the packaging process. The size of the holes 52 is sufficiently small so as not to adversely affect the electromagnetic isolation provided by the wall. As shown in FIG. 3, an electrically conductive isolation wall 50 may be inserted into a slot or aperture 76 in the ground plane 74, thereby making electrical connection to that ground plane which is a ground node in the semiconductor device. Slot 76 may be formed within ground plane 74 by any suitable etching or material removal process.

Figure 4:
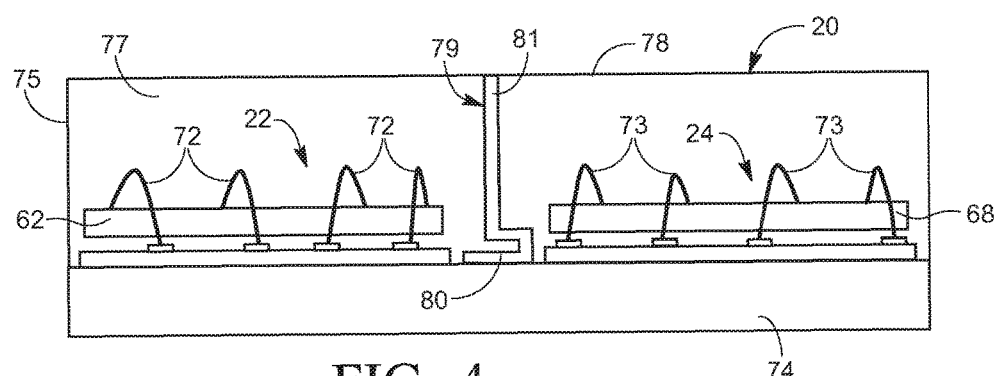
FIG. 4 is a cross section view taken along line A-A in FIG. 2A illustrating another embodiment of the isolation wall.

FIG. 4 depicts an alternative isolation wall 79 having a bottom section that is bent to form a base 80 extending perpendicular to the main section 81 of the wall for supporting the isolation wall 79 on the surface of the ground plane 74. The base 80 may, in some cases, be used as a substitute for slot 76 in the ground plane as shown in FIG. 4. The base 80 is secured in a manner that establishes electrical contact with the ground plane 74, or ground node. For example, the base 80 may be soldered, brazed, or attached by an electrically conductive adhesive or epoxy to the ground plane 74. Alternatively, either version of the conductive isolation wall 50 or 79 can be attached to a ground pad, a ground conductor, or other ground node of the circuitry within the semiconductor package 20.

Figure 5:
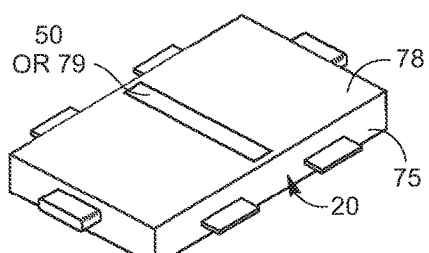
FIGS. 5 and 6 are perspective views of two embodiments of a completed semiconductor package with the circuitry encapsulated in a resin body.
Figure 6:
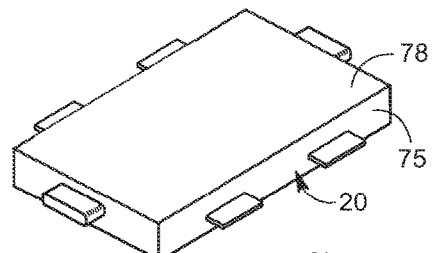

The isolation walls 50 and 79 extend upward within the encapsulant 77 and may be exposed through the top surface 78 of the housing 75 of the semiconductor package 20 as shown in FIG. 5. Alternatively, the edge of the wall 50 that is remote from the ground plane 74 may be spaced slightly from the top housing surface 78 so that some of the encapsulant 77 extends across that remote edge as shown in FIG. 6.

Figure 7:
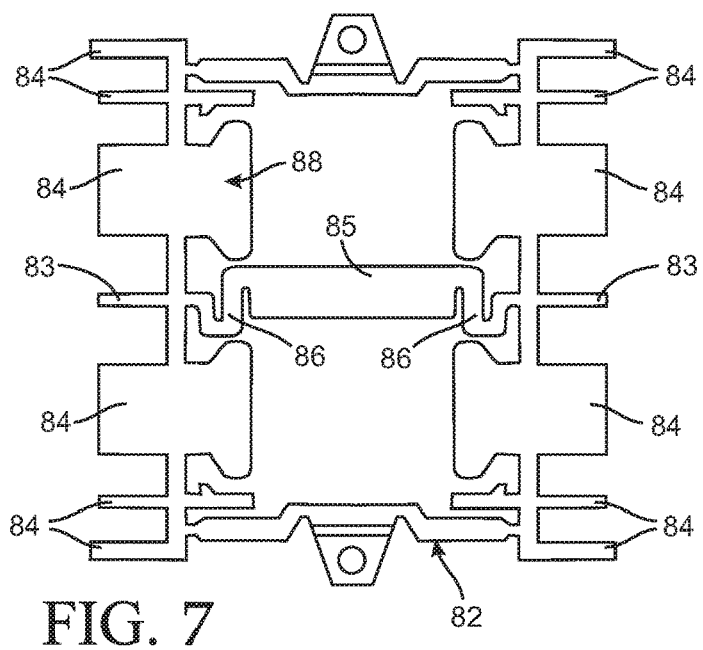
FIG. 7 is a top view of an embodiment of a lead frame for a semiconductor package with the isolation wall formed by part of the lead frame.
Figure 8:
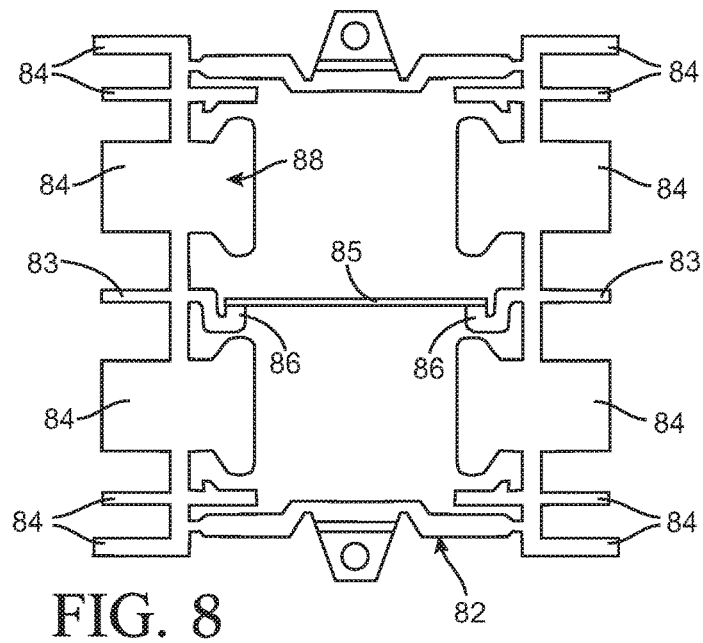
FIG. 8 is a top view of the lead frame of FIG. 7 with the isolation wall bent upward into a final position.
Figure 9:
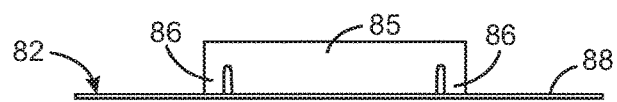
FIG. 9 is a side view of the lead frame of FIG. 7 with the bent isolation wall.

With reference to FIG. 7, the isolation wall 50 may be formed alternatively as part of the lead frame 82 of the semiconductor package 20. The lead frame 82 is fabricated in a convention manner from a flat electrically conductive sheet. The lead frame 82 has a plurality of lead fingers 84 and a pair of ground fingers 83 which will be connected to ground node in the semiconductor package 20. A wall section 85 is formed in the center of the lead frame 82 with serpentine links 86 at each end connecting the wall section to the pair of ground fingers 83. The wall section 85 is initially formed coplanar with the remainder 88 of the lead frame 82. Prior to assembly of the semiconductor package 20, the wall section 85 is bent transverse to the plane of the lead frame sheet as shown in FIGS. 8 and 9. Specifically the wall section 85 is twisted by a particular amount (in some embodiments, approximately 90 degrees) about the links 86 into the desired final position of the isolation wall 50, which can be perpendicular to the plane of the remainder 88 of the lead frame sheet. The two links 87 connecting the wall section 85 to the pair of ground fingers 83 connects the resulting isolation wall 50 to ground or reference potential during operation of the Doherty power amplifier 10.

Figure 10:
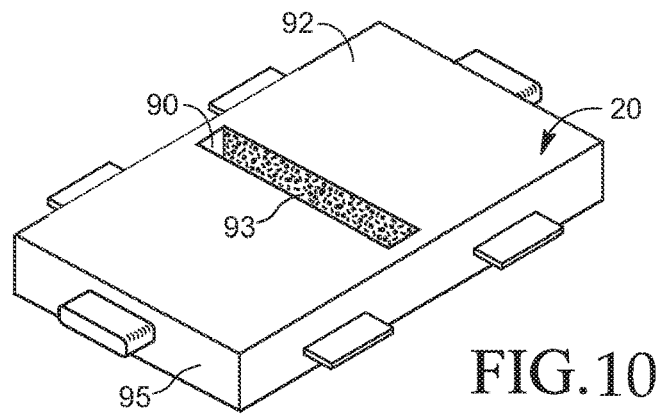
FIG. 10 is a perspective view of a completed semiconductor package with a slot created therein and another embodiment of an isolation wall formed in the slot.

In the embodiments of the semiconductor package 20 described thus far, the isolation wall 50 or 79 is fabricated on the ground plane 74 prior to encapsulation of the circuitry. FIG. 10 depicts an alternative embodiment in which the conductive plane of the isolation wall 50 is fabricated after the circuitry has been encapsulated to form the semiconductor package 20. After encapsulation, a slot 90 is formed through the top surface 92 of the package housing 95 into the encapsulation material. For example, the slot 90 may be created by cutting the package with a blade, a saw, a laser beam, or similar device. The slot 90 extends downward through the encapsulation material between the carrier amplifier 22 and the peaking amplifier 24 until reaching the ground plane 74, the heat sink, or the die of the semiconductor device, whichever will provide a ground connection.

Then a major surface of the slot 90 extending across the semiconductor package 20 is coated with an electrically conductive material 93 to form the isolation wall. For example, an electrically conductive paint, epoxy, or other conductive material can be applied to one or more of the slot surfaces. Alternatively at least one major slot surface may be plated with metal. That electrically conductive material 93 extends across the bottom of the slot 90 thereby making electrical contact with the ground plane 74, the heat sink, or the die of the semiconductor device to ground the conductive material 93 and form the isolation wall.

Figure 11:
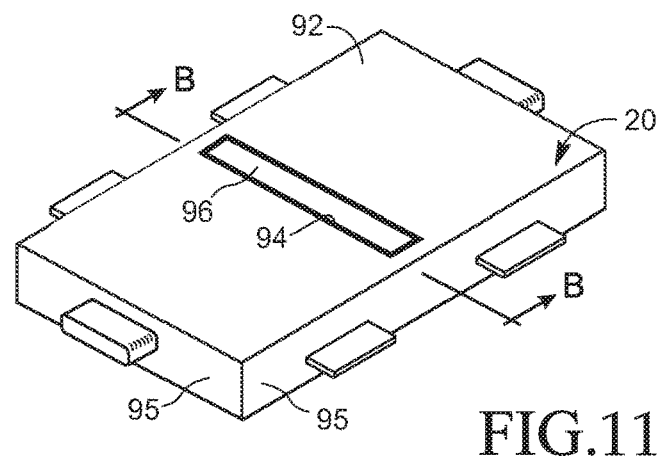
FIG. 11 is a perspective view of a completed semiconductor package with a slot created therein and an isolation wall inserted into the slot according to another embodiment.
Figure 12:
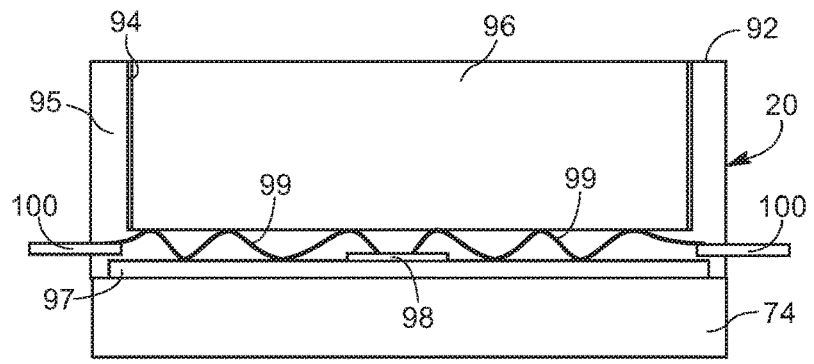
FIG. 12 is a cross section view taken along line B-B in FIG. 11 showing a first manner of connecting the isolation wall to ground.

FIG. 11 illustrates another technique for forming the isolation wall in a slot 94 created in an encapsulated semiconductor package 20. After the slot 94 is formed in the semiconductor package 20, an isolation wall 96, formed by a body of electrically conductive material, is inserted into the slot. A number of techniques can be employed to provide an electrical connection between the isolation wall 96 and either the ground plane of the circuit or a ground conductor on the circuit die. For example, as shown in FIG. 12, the die 97 may have a ground node 98 thereon and a plurality of wire bonds 99 extending between that ground node and ground terminals 100 of the semiconductor package 20. In this embodiment, the slot 94 is cut into the semiconductor package 20 to a depth that just exposes the tops of the wire bonds 99 that connect to the ground node 98. As a result, when the body of the isolation wall 96 is inserted in the slot 94, the bottom edge of the body makes electrical contact with the exposed sections of the wire bonds 99 thereby grounding the isolation wall. The isolation wall 96 may be secured in the semiconductor package 20 by epoxy or other type of adhesive, for example.

Figure 13:
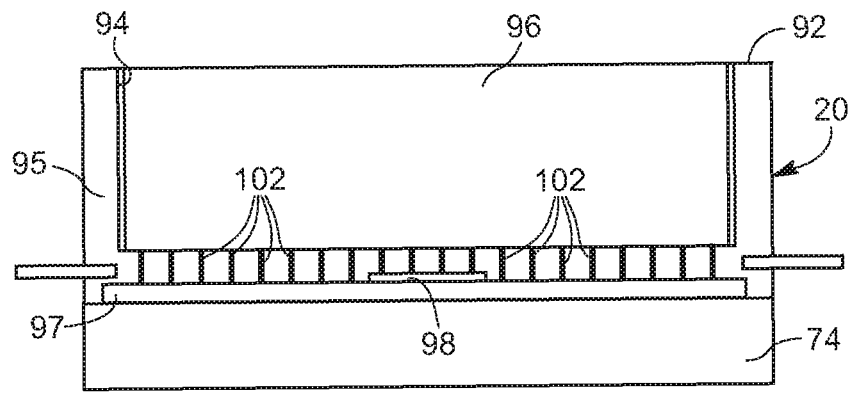
FIG. 13 is a cross section view taken along line B-B in FIG. 11 showing a second manner of connecting the isolation wall to ground.

FIG. 13 depicts a different technique for establishing electrical contact between the body of the isolation wall 96 and a ground node 98 within the semiconductor package 20. Here, prior to encapsulation, one or more electrically conductive posts 102 are attached to the ground node, such as a ground conductor of the semiconductor die 97 or the ground plane 74. These posts 102 become encapsulated in the material that forms the housing 95 of the semiconductor package 20. During or after encapsulation, a slot 94 is formed in the package to a sufficient depth to expose the electrically conductive posts 102. Unlike the use of wire bonds 99 in FIG. 12, where care must be taken so that the slot is not cut so deep as to sever the wire bonds, the depth of the slot 94 in FIG. 13 is not as critical as long as the posts 102 are exposed. Then, when the isolation wall 96 is inserted into the package housing 95, the lower edge of that wall contacts the exposed ends of the posts 102 thereby grounding the isolation wall. As with the prior embodiment, the isolation wall 96 can be secured within the slot 94 by epoxy or other type of adhesive, for example. Use of electrically conductive epoxy at the bottom of the slot 94 aids in making a ground connection to the posts 102.

Figure 14:
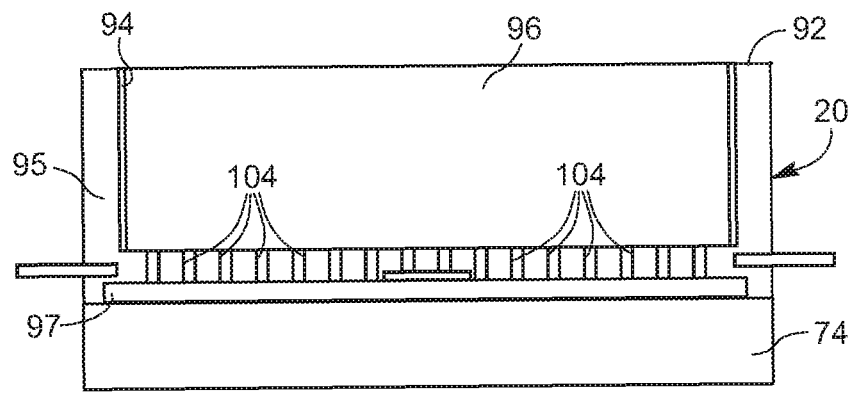
FIG. 14 is a cross section view taken along line B-B in FIG. 11 showing a third manner of connecting the isolation wall to ground.

FIG. 14 illustrates yet another technique for making an electrical contact between the isolation wall 96 and a ground node of electronic circuit in the semiconductor package 20. In this instance, after the slot 94 is cut in the housing 95, a plurality of vias 104 are formed between the bottom of the slot 94 and either a ground conductor on the die 97, the ground plane 74 or another ground node. Specifically the vias 104 are formed by cutting apertures through the encapsulant of the housing 95 between the bottom of the slot 94 and the respective ground node. An electrically conductive material, such as a metal plating or conductive paint or other electrically conductive material, is applied to the walls of those apertures and then outward from the apertures across the bottom surface of the slot. Alternatively, the apertures can be filled with an electrically conductive material so as to form a structure similar to the posts 102. In both these instances, when the isolation wall 96 is inserted into the slot 94, the bottom edge of that wall makes electrical contact with the vias 104 thereby connecting the wall to the circuit ground. Use of electrically conductive epoxy at the bottom of the slot 94 to secure the isolation wall 96 in place also aids in making a ground connection to the vias 104.

The techniques shown in FIGS. 12-14 for establishing electrical contact with the isolation wall also can be used when the wall is formed by a coating on a surface of the slot in the semiconductor package 20 as illustrated in FIG. 10.

Although embodiments have been described herein with respect to a Doherty power amplifier with one carrier amplifier and one peaking amplifier, those of skill in the art would understand, based on the description herein, that embodiments of the inventive subject matter may be used in conjunction with virtually any type of multiple path amplifier. Accordingly, the various embodiments are not limited to use with Doherty amplifiers, nor are they limited to use with amplifiers having only two amplification paths. For example, an alternate embodiment may include a device with three or more amplification paths, and isolation walls may be provided between each set of adjacent amplification paths. In addition, although various embodiments have been described with respect to overmolded (encapsulated) semiconductor device packages, the inventive concepts also could be applied to air cavity packages and other types of packages.

In one embodiment, a semiconductor device includes a substrate, a first circuit on the substrate and comprising a plurality of electrical components, and a second circuit on the substrate and comprising a plurality of electrical components. The semiconductor device includes an isolation wall formed of electrically conductive material located between the first circuit and the second circuit. The isolation wall is configured to reduce electromagnetic coupling between the first circuit and the second circuit during an operation of at least one of the first circuit and the second circuit.

In another embodiment, a Doherty amplifier includes a substrate, a carrier amplifier on the substrate, and a peaking amplifier on the substrate adjacent to the carrier amplifier. The Doherty amplifier includes an isolation wall formed of electrically conductive material located between the carrier amplifier and the peaking amplifier. The isolation wall is configured to reduce an electromagnetic coupling between the carrier amplifier and the peaking amplifier during an operation of the Doherty amplifier.

In another embodiment, a method of fabricating a semiconductor device includes forming a first circuit on a substrate, and forming a second circuit on a substrate adjacent to the first circuit. The method includes locating an isolation wall of electrically conductive material between the first circuit and the second circuit. The isolation wall is configured to reduce electromagnetic coupling between the first circuit and the second circuit during an operation of the semiconductor device.

The foregoing description was primarily directed to a preferred embodiment of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

What is claimed is:

1. A method of fabricating a semiconductor device, the method comprising:
 forming a first circuit on a substrate;
 forming a second circuit on a substrate adjacent to the first circuit;
 forming a lead frame from an electrically conductive sheet, wherein the lead frame includes first and second leads within a plane of the electrically conductive sheet and a wall section that is transverse to the plane of the electrically conductive sheet;
electrically coupling the first circuit to the first lead with a first wire bond array;
electrically coupling the second circuit to the second lead with a second wire bond array; and
locating the wall section between the first circuit and the second circuit, the wall section extending above a height of the first and second wire bond arrays, and the wall section being configured to reduce electromagnetic coupling between the first circuit and the second circuit during an operation of the semiconductor device.

2. The method as recited in claim 1, wherein the wall section initially is within the plane of the electrically conductive sheet, and the method further comprises bending the wall section transverse to the plane of the electrically conductive sheet.

3. The method as recited in claim 1, wherein the wall section is connected by a link to a remainder of the lead frame and the link is bent so that the wall section is transverse to the remainder of the lead frame.

4. The method as recited in claim 1, wherein the wall section is formed of electrically conductive material.

5. The method as recited in claim 1, further comprising electrically connecting the wall section to a ground potential node.

6. The method as recited in claim 5, wherein electrically connecting the wall section to the ground potential node is performed by one of soldering, brazing, and adhering the wall section to the ground potential node.

7. The method as recited in claim 5, wherein electrically connecting the wall section to the ground potential node includes receiving the wall section within an aperture in the ground potential node.

8. The method as recited in claim 1, wherein the first circuit is a carrier amplifier of a Doherty amplifier; and the second circuit is a peaking amplifier of the Doherty amplifier.

9. A method of fabricating a Doherty amplifier, the method comprising:
forming a carrier amplifier on a substrate, the carrier amplifier including a first transistor and a first wire bond array electrically coupled between the first transistor and a first lead;
forming a peaking amplifier on the substrate adjacent to the carrier amplifier, the peaking amplifier including a second transistor and a second wire bond array electrically coupled between the second transistor and a second lead; and
locating an isolation wall formed of electrically conductive material between the carrier amplifier and the peaking amplifier above a surface of the substrate, the isolation wall formed of a body of material that is oriented perpendicular to the surface of the substrate and extending above a height of the first and second wire bond arrays, the isolation wall being configured to reduce an electromagnetic coupling between the carrier amplifier and the peaking amplifier during an operation of the Doherty amplifier, wherein the isolation wall is formed by a section of a lead frame that also includes the first lead and the second lead.

10. The method as recited in claim 9, wherein the lead frame is formed by an electrically conductive sheet, and the isolation wall is formed by a section of the lead frame that is transverse to a plane of the electrically conductive sheet.

11. The method as recited in claim 10, wherein the section is connected by a link to a remainder of the lead frame and the method further comprises bending the link so that the section is transverse to the remainder of the lead frame.

12. The method as recited in claim 9, further comprising electrically connecting the isolation wall to a ground potential node.

13. The method as recited in claim 12, wherein the isolation wall is electrically connected to the ground potential node by one of solder, brazing material, and adhesive.

14. The method as recited in claim 12, wherein electrically connecting the isolation wall to a ground potential node comprises receiving the isolation wall within an aperture in the ground potential node.

* * * * *